(12) United States Patent
Doytcheva et al.

(10) Patent No.: US 8,329,366 B2
(45) Date of Patent: Dec. 11, 2012

(54) APPARATUS AND METHOD FOR PROVIDING RESIST ALIGNMENT MARKS IN A DOUBLE PATTERNING LITHOGRAPHIC PROCESS

(75) Inventors: Maya Angelova Doytcheva, Eindhoven (NL); Mircea Dusa, Wezembeek-Oppem (BE); Richard Johannes Franciscus Van Haren, Waalre (NL); Harry Sewell, Ridgefield, CT (US); Robertus Wilhelmus Van Der Heijden, Tilburg (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 314 days.

(21) Appl. No.: 12/768,128

(22) Filed: Apr. 27, 2010

(65) Prior Publication Data

US 2010/0323171 A1 Dec. 23, 2010

Related U.S. Application Data

(60) Provisional application No. 61/182,411, filed on May 29, 2009.

(51) Int. Cl.
*G03F 9/00* (2006.01)

(52) U.S. Cl. .......... 430/22; 430/312; 430/313; 430/315; 430/322; 430/324; 430/328; 430/330

(58) Field of Classification Search .................... 430/22, 430/312, 313, 315, 322, 324, 328, 330
See application file for complete search history.

(56) References Cited

U.S. PATENT DOCUMENTS

2011/0070545 A1* 3/2011 Dunn et al. ................ 430/323

* cited by examiner

*Primary Examiner* — Christopher Young

(74) *Attorney, Agent, or Firm* — Sterne, Kessler, Goldstein & Fox P.L.L.C.

(57) ABSTRACT

A method is described for alignment of a substrate during a double patterning process. A first resist layer containing at least one alignment mark is formed on the substrate. After the first resist layer is developed, a second resist layer is deposited over the first resist layer, leaving a planar top surface (i.e., without topography). By baking the second resist layer appropriately, a symmetric alignment mark is formed in the second resist layer with little or no offset error from the alignment mark in the first resist layer. The symmetry of the alignment mark formed in the second resist can be enhanced by appropriate adjustments of the respective thicknesses of the first and second resist layers, the coating process parameters, and the baking process parameters.

13 Claims, 11 Drawing Sheets

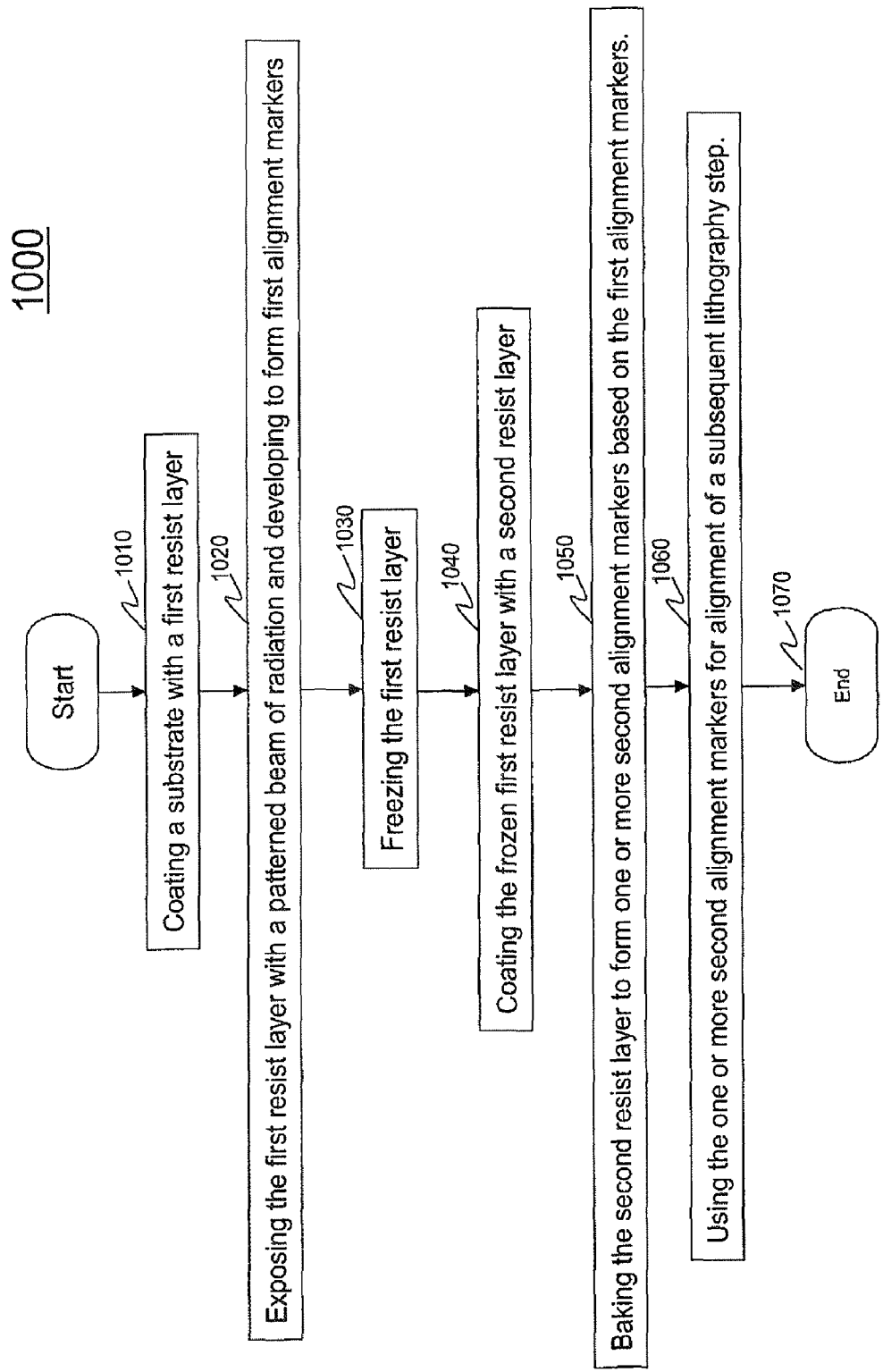

APPARATUS AND METHOD FOR PROVIDING RESIST ALIGNMENT MARKS IN A DOUBLE PATTERNING LITHOGRAPHIC PROCESS

CROSS REFERENCE TO RELATED APPLICATIONS

This patent application claims the benefit of U.S. Provisional Patent Application No. 61/182,411 filed on May 29, 2009, entitled "Apparatus And Method For Providing Resist Alignment Marks In A Double Patterning Lithographic Process", which is incorporated by reference herein in its entirety.

BACKGROUND OF THE INVENTION

1. Field of the Invention

Embodiments of the present invention relate generally to lithography, and more particularly to improving alignment targets in lithographic patterning processes, such as a double patterning process.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of resist material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti parallel to this direction. It is also possible to transfer the pattern from the patterning device to the substrate by imprinting the pattern onto the substrate.

The manufacture of an IC chip involves the fabrication of many layers. Within each layer, multiple or double patterning may be used to generate patterns with a smaller critical dimension than that achievable using a traditional patterning process. There are a number of different methods of achieving double patterning. The first of these is known as lithographic-etch-lithography-etch (LELE) in which a first pattern is exposed and etched. A second pattern, with features located in the spaces between the features of the first pattern, is then exposed. Next the features of the second pattern are etched into the substrate. Thus, a pattern of smaller dimensions than the minimum lithographic pitch can be generated. Another similar double patterning technique is known as lithography-freeze-lithography-etch (LFLE). A pattern is exposed in the resist, which is then "frozen", usually by chemical fixation. A second pattern can then also be exposed in a freshly deposited resist layer and both patterns are then etched into the substrate. Another double patterning method is known as the spacer method. In the spacer method a sacrificial template is put down and spacers placed either side, and adjacent to, the sacrificial template. The template is then removed and the resulting pattern etched into the substrate.

Using LELE or LFLE, there exists the potential for error in the placement of features during the second lithography step with respect to the features from the first lithography step. However, in order to maximize the benefits of double patterning, it is imperative that the first and second lithography steps be aligned with little or no alignment error.

BRIEF SUMMARY OF THE INVENTION

Embodiments of the present invention generally relate to improving alignment marks in lithographic patterning processes such as a double patterning process.

In one embodiment of the present invention, a method of semiconductor manufacturing using a double patterning process is provided. The method includes coating a substrate with a first resist-layer, followed by exposing and developing the first resist layer to form the first pattern including one or more alignment marks. After freezing the first resist layer, the first resist layer is planarized by coating the first lithography pattern with a second resist layer. By soft baking the second resist layer, the shrinkage effects of the second resist layer can be exploited to provide alignment mark topography based on the one or more alignment marks in the first resist layer. Such alignment mark topography can then be used to support the generation of alignment signals with little alignment error.

In one embodiment, the coat step and the bake step for the second resist layer are adjusted to provide symmetric alignment mark topography. Such adjustment includes selecting parameters for one or more of resist polymer concentration, resist viscosity, spin coat duration, spin coating speed, spin speed ramp rate, soft bake duration and bake temperature. In another embodiment, mark biasing and/or mark segmentation are tuned based on the resist layer thicknesses to set the alignment mark topography and alignment signal. In another embodiment, the thickness of the first resist layer and the second resist layer are controlled with respect to each other.

The present invention also relates to an article of manufacture including: a substrate coated with a first resist layer; one or more alignment marks formed in the first resist layer; and a second resist layer coating the first resist layer. The first resist layer is planarized by coating the first lithography pattern with a second resist layer. By soft baking the second resist layer, the shrinkage effects of the second resist layer can be exploited to provide alignment mark topography on the article of manufacture based on the one or more first alignment marks. Such alignment mark topography can then be used to support the generation of alignment signals with little alignment error in the subsequent double patterning processing of the article of manufacture.

The present invention also relates to a system for manufacturing a semiconductor device lithographically. The system includes an illumination source to provide an alignment beam at a specified wavelength for reading an alignment mark in a double patterning process. The system also includes an optical alignment system to detect alignment marks formed after coating a second resist layer over a first resist layer containing one or more first alignment marks. The resulting alignment marks result from soft baking the second resist layer, and the shrinkage properties of the second resist layer.

BRIEF DESCRIPTION OF THE DRAWINGS/FIGURES

The above summary sets forth many, but not all aspects of the invention. Other aspects of the invention should be apparent to those skilled in the art to which the invention pertains by reading the descriptions of various "embodiments" of the invention in conjunction with reference to the drawings. In setting forth the following embodiments, the present invention is illustrated by way of example, and not by way of limitation. In the figures, like reference numerals refer to similar elements.

FIGS. 1A and 1B respectively depict reflective and transmissive lithographic apparatuses, according to one embodiment of the present invention.

FIGS. 2A-2G schematically show example steps in a Litho Freeze Litho Etch (LFLE) double patterning process in the product area.

FIGS. 3A-3D schematically show example steps in a Litho Freeze Litho Etch (LFLE) double patterning process in the alignment mark area.

Figure 7A:
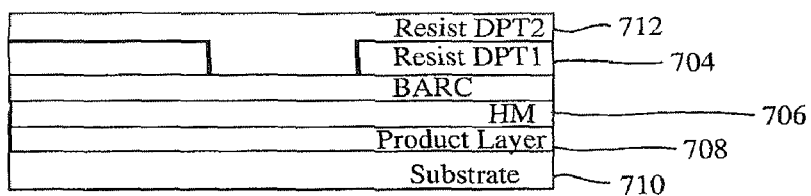
Figure 7B:
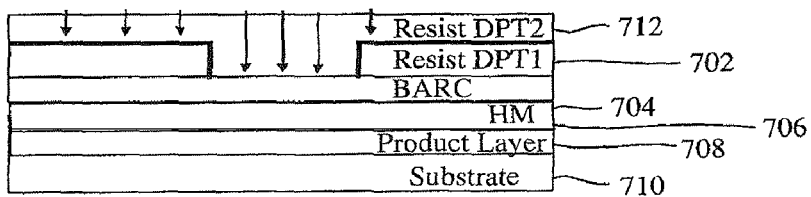
Figure 7C:
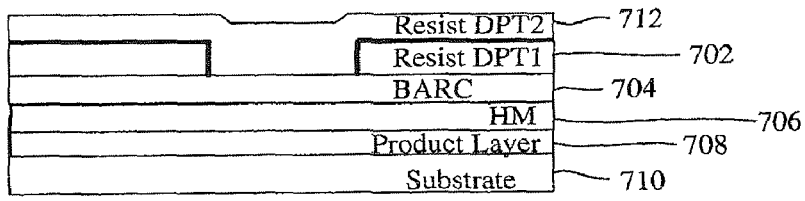

FIGS. 7A-7C schematically show the process for forming a symmetric alignment mark, according to one embodiment of the present invention.

Figure 8A:
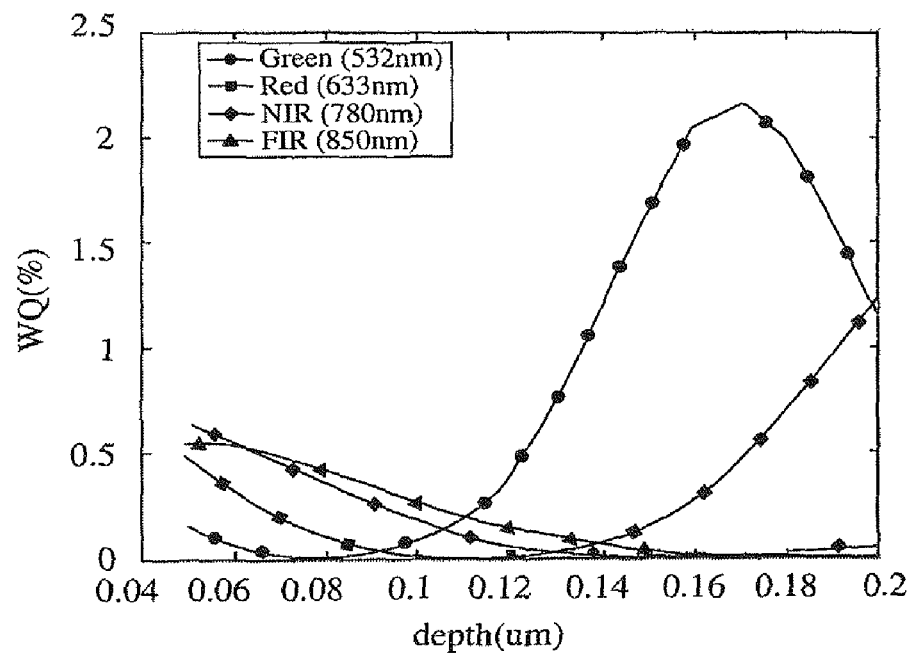
Figure 8B:
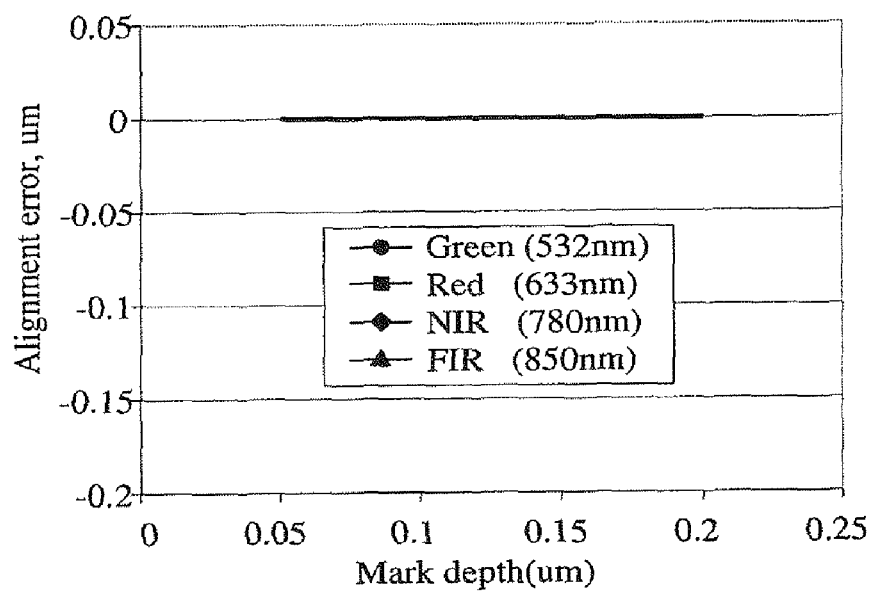

FIGS. 8A and 8B schematically show a simulated alignment signal and the process-induced alignment error for a symmetric alignment mark, according to one embodiment of the present invention.

Figure 9A:
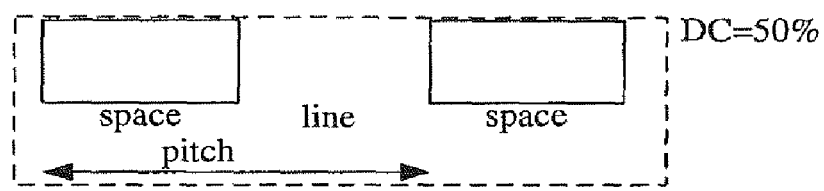
Figure 9B:
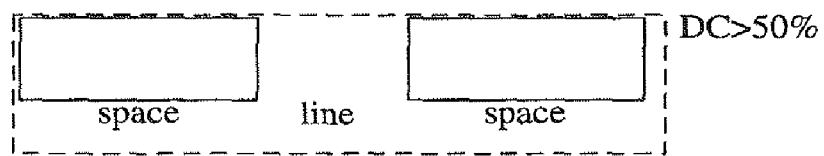

FIGS. 9A and 9B schematically show mark biasing, according to one embodiment of the present invention.

FIG. 10 schematically shows a flow chart depicting an embodiment of a method of manufacturing according to the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other foams of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1A:
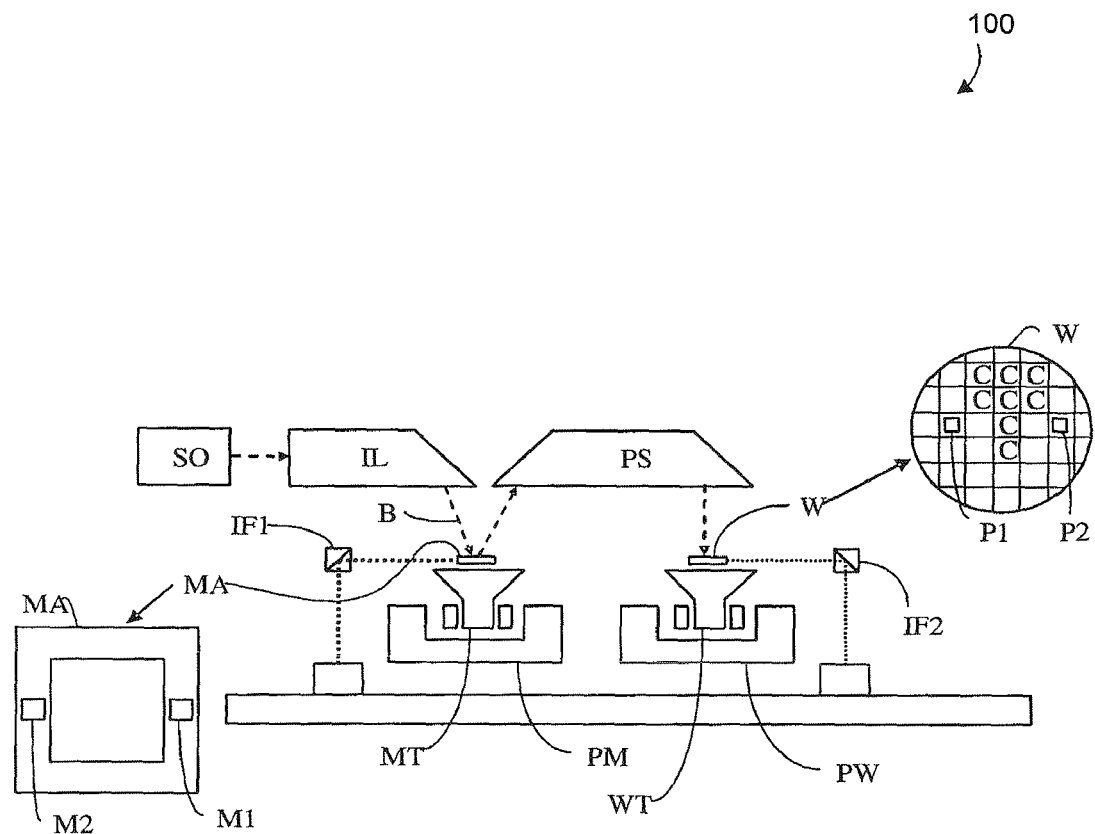
Figure 1B:
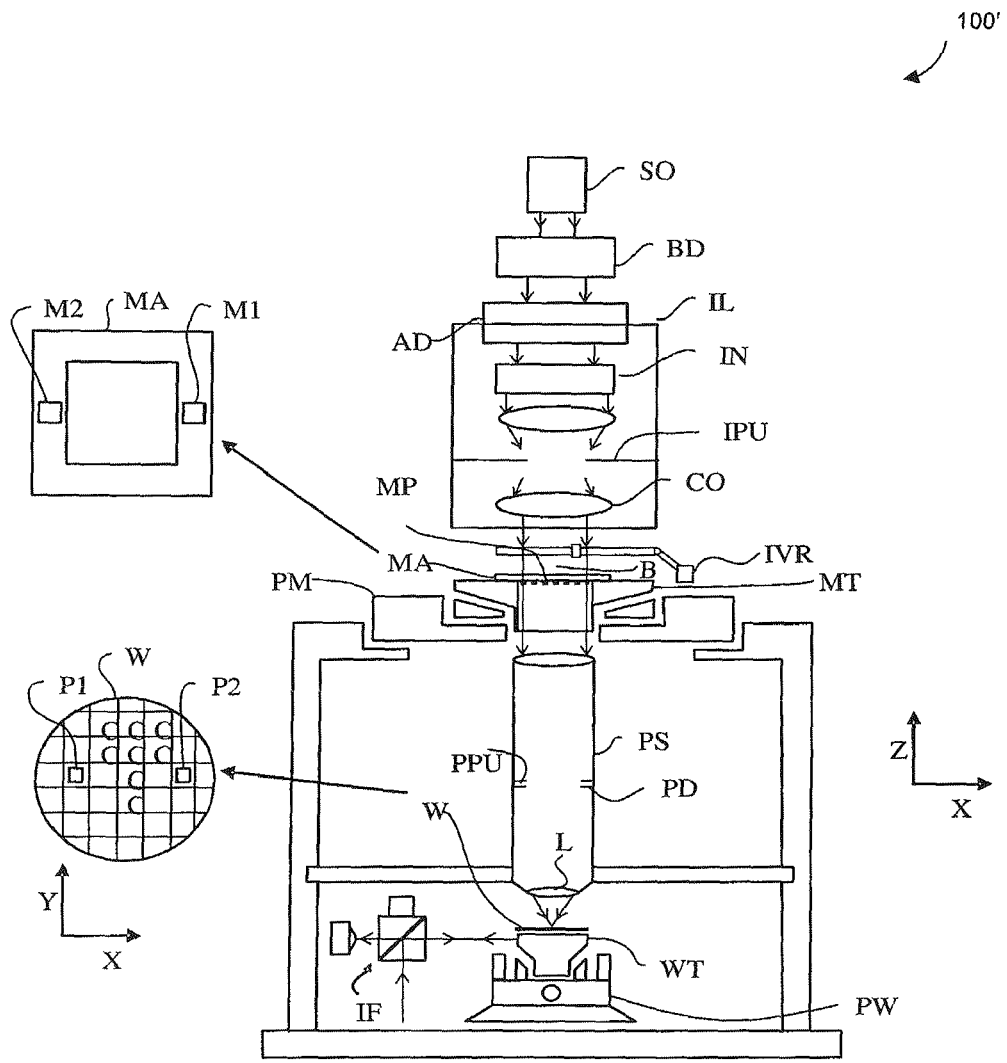
Figure 2A:
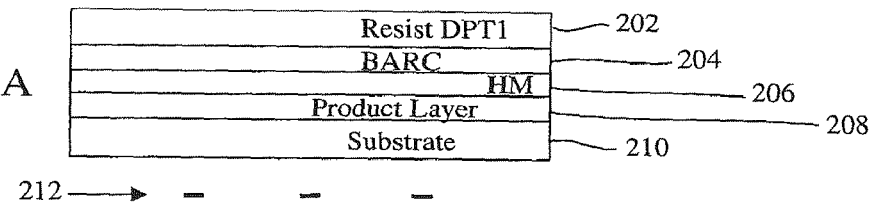
Figure 2B:
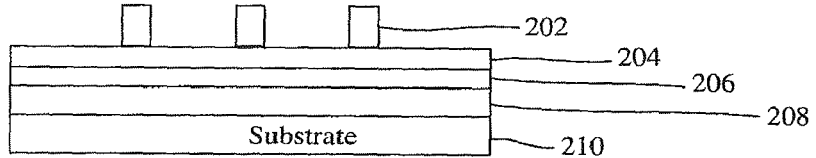
Figure 2C:
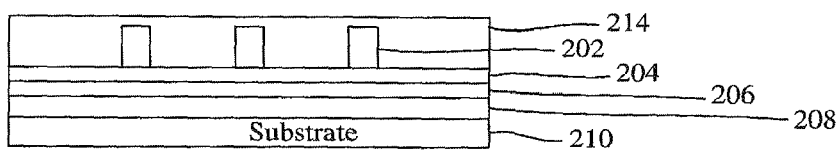
Figure 2D:
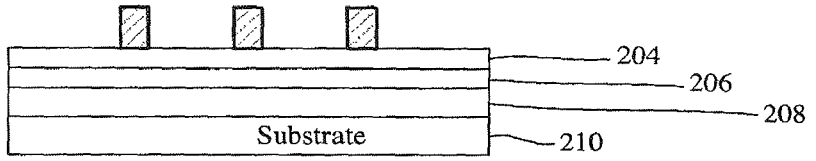
Figure 2E:
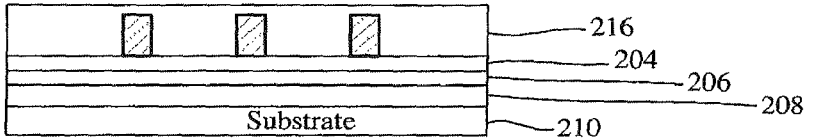
Figure 2F:
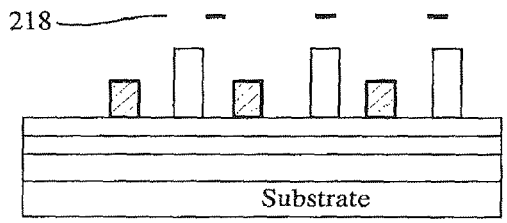
Figure 2G:
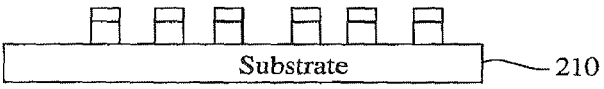
Figure 3A:
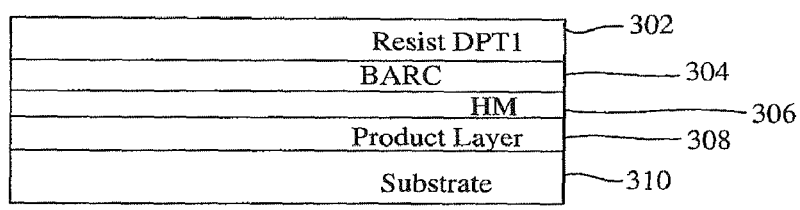
Figure 3B:
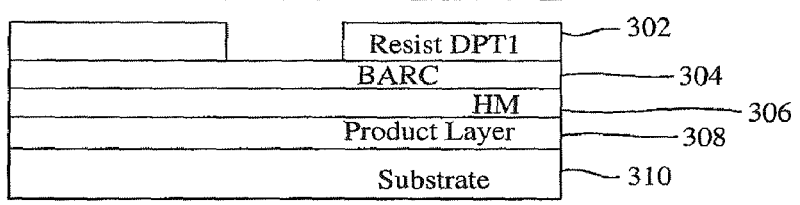
Figure 3C:
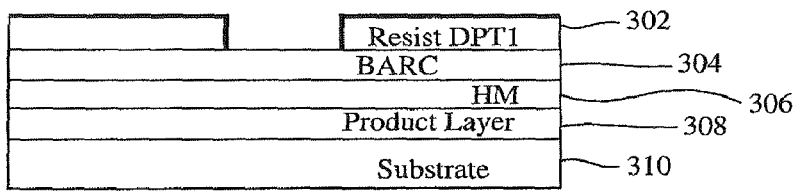
Figure 3D:
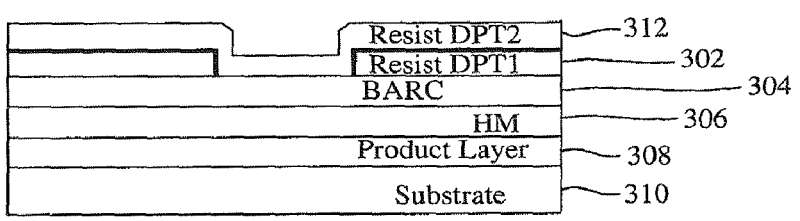

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as α-outer and α-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ, of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

Improvements in the resolution of optical lithography may be achieved with the Double Patterning Technique (DPT). The double patterning technique uses two exposure steps with two different masks and one or more processing steps in between the two exposures, such that each step forms part of the final pattern. In this way the resulting final features can be made smaller or denser, as compared to the use of only one exposure step. By exposing the wafers twice, with the second pattern exposed interstitially between the first pattern, the frequency or density of the exposed features is doubled. Several types of double patterning techniques exist, including the spacer technique, and the Litho-Process-Litho-Etch technique (LPLE). One example of the Litho-Process-Litho-Etch technique (LPLE) is the Litho-Etch-Litho-Etch technique. Another example of the Litho-Process-Litho-Etch technique is the Litho Freeze Litho Etch (LFLE) technique.

In the Litho-Process-Litho-Etch (LPLE) technique the first layer exposure is developed and processed, e.g. "frozen", in the resist. The wafer is then coated with a second resist followed by the second exposure. The advantage of this technique is that the wafer remains in the litho cluster. The time between the first exposure and the second exposure can therefore be reduced to a minimum. In addition, the LPLE technique requires only one etch step. The second costly etching step is eliminated, which helps reducing the final production costs.

FIG. 2 illustrates example steps in the LFLE process for the product area. FIG. 2A portrays an initial stack of wafer layers, with a first resist layer 202 deposited on top of a layer of Bottom Anti-Reflective Coating (BARC) 204, a hard mask layer (HM) 206, a product layer 208, and the substrate 210. FIG. 2B portrays a first double patterning step (DPT1), where a mask 212 has been used in the exposure of first resist layer 202 followed by development of the exposed pattern. FIG. 2C portrays a coating and baking of a layer of freeze material 214. Coating can be performed by various means including by spin coater or device enabling the spreading of material by centrifugal force. Baking can be performed by various means including hotplate, oven or other thermal source. Other tools for coating and baking can be employed, as would become apparent to persons having ordinary skill in the art. FIG. 2D portrays removal of the unreacted excess of freeze material 214. FIG. 2E illustrates coating of a second resist layer 216. FIG. 2F portrays a second double patterning step (DPT2), where a mask 218 has been used in the exposure of second resist layer 216, followed by development of the exposed pattern. FIG. 2G illustrates the wafer following the etching step.

Since the final pattern is defined in two exposure steps (DPT1 and DPT2), the alignment of the second exposure (DPT2) to the first exposure (DPT1) is very important for the resulting final pattern. Thus, the alignment between the two exposures (DPT2 to DPT1) is critical. In the case where the LPLE process is applied to layer n (where n≧2 such as a gate layer, a contact layer or a back-end-of-line (BEOL) layer), a wafer alignment scheme can be established using alignment marks taken from one of the previously processed layers. Use of previously processed layers is often referred to as indirect alignment. However, even though previous alignment marks can be used, this may not be an optimal alignment scheme. A direct alignment scheme is desired for satisfactory alignment of the two double patterning layers (i.e., for DPT2 to DPT1 alignment). When the targeted double patterning layer is layer #1 (i.e., the STI or active area layer), there are no previous alignment marks to take advantage of and therefore the alignment marks must be defined in the first DPT step (DPT1), i.e., in the processed or "frozen" resist. These "frozen" alignment marks are formed in the same process as the first pattern. This approach is preferable to creation of a so-called zero-layer that is dedicated to alignment marks because this would require costly additional lithographic and etch process steps.

FIG. 3 illustrates example steps in a Litho Freeze Litho Etch (LFLE) process in the alignment mark area, including the formation of a frozen resist mark. FIG. 3A portrays an initial stack of wafer layers, with a first resist layer 302 deposited on top of a layer of Bottom Anti-Reflective Coating (BARC) 304, a hardmask (HM) layer 306, a product layer 308, and a substrate 310. FIG. 3B portrays a first double patterning step (DPT1), where a resist mark is defined in first resist layer 302. FIG. 3C portrays freezing (i.e., coating with freeze material, baking and removal of the unreacted excess of freeze material) of the first resist mark in first resist layer 302. FIG. 3D illustrates coating of a second resist layer 312 prior to alignment and patterning of the second double patterning step (DPT2).

Figure 4A:
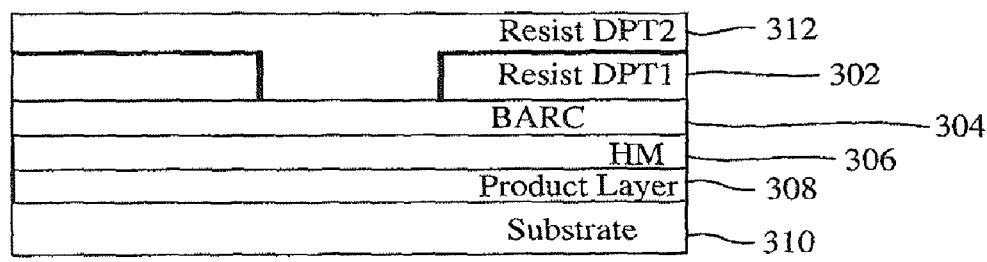
FIGS. 4A and 4B illustrate the limited contrast difficulty with frozen resist marks in a double patterning process.
Figure 4B:
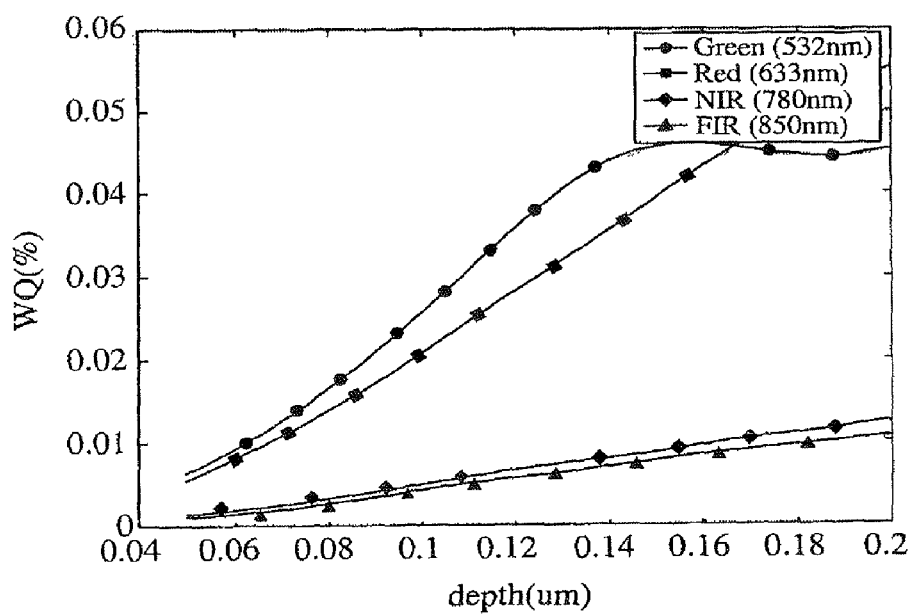

However, notwithstanding the simplicity of the LFLE process, at least two problems arise with the "frozen" resist marks defined in the first lithographic step of the double patterning process. FIG. 4 illustrates the first problem in which contrast is limited between first resist layer 302 and second resist layer 312. Specifically, the frozen resist mark in first resist layer 302 (DPT1) is planarized by the second resist layer 312 (DPT2), as shown in FIG. 4A. Because the optical properties of first resist layer (DPT1) and second resist layer (DPT2) are similar, the contrast between the two layers is limited, resulting in a very poor alignment signal, as shown in FIG. 4B. Accordingly, a planarized frozen mark generally cannot be used for alignment purposes.

Figure 5A:
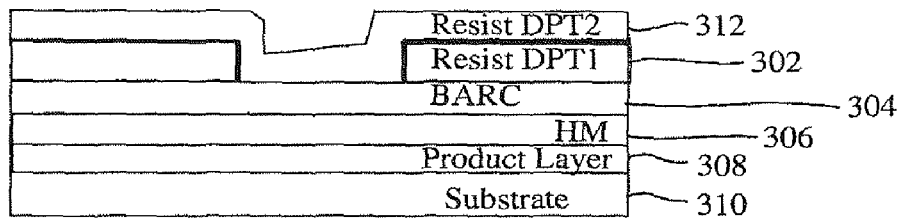
FIGS. 5A-5C illustrate the non-conformal profile of an alignment mark in the spin coating process of a double patterning process.
Figure 5B:
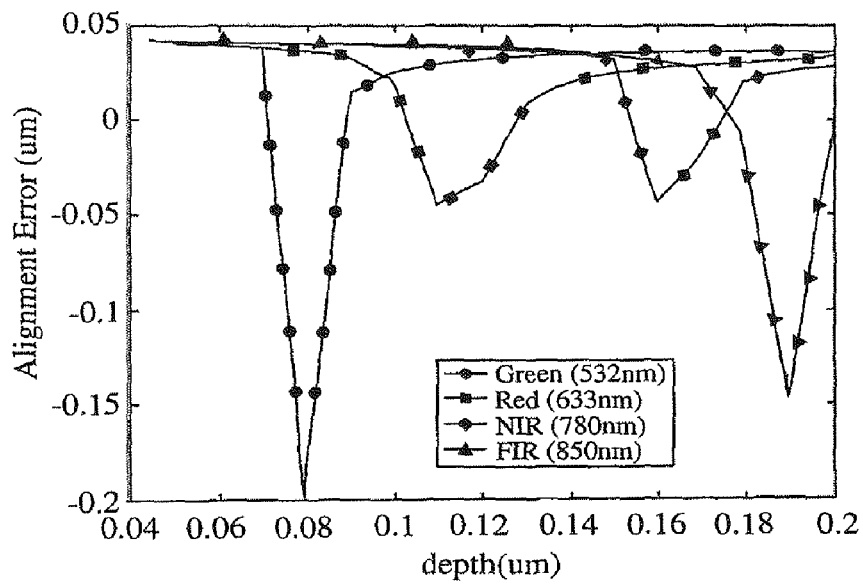
Figure 5C:
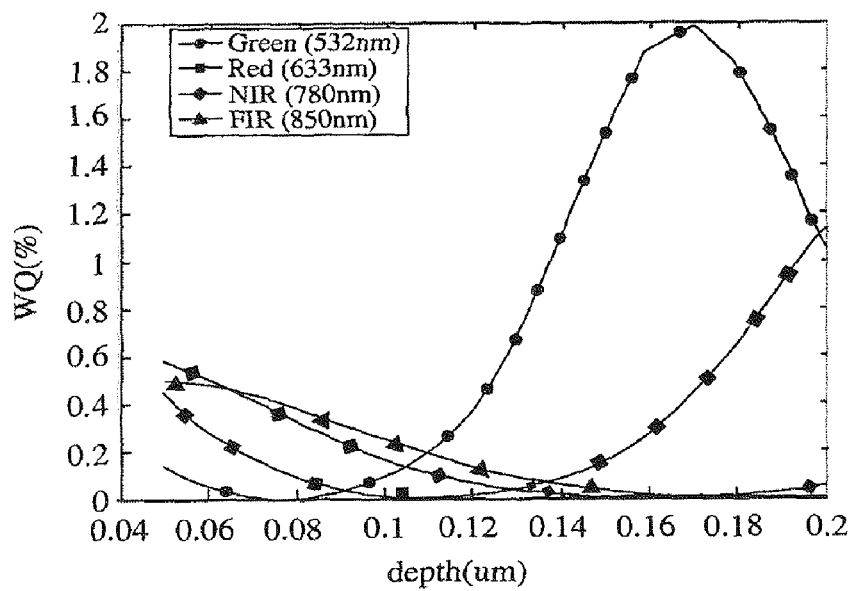

FIG. 5 illustrates a second problem. As shown in FIG. 5A, second resist layer 312 (DPT2) forms a non-conformal profile over the alignment mark during the spin coating process. From the resulting mark topography, an alignment error results as shown in simulation in FIG. 5B based on the generated alignment signal, as shown in FIG. 5C for various wavelengths. This is caused by the spin coating of second resist layer 312 (DPT2) which introduces mark asymmetry that results in alignment and overlay errors. More specifically, asymmetric spin coating the second resist layer 312 (DPT2) causes wafer magnification (scaling) and wafer rotation, which results in adverse variations across and between wafers.

Embodiments of the present invention address the above problems by forming a processed resist alignment mark, e.g., a "frozen" resist alignment mark, using two steps. A first step forms a planarized mark profile after spin-coating of second resist layer 312 (DPT2), so that mark asymmetry is not introduced. A second step provides mark topography during a "soft bake" step of second resist layer 312 (DPT2), without the asymmetry as previously shown in FIG. 5. During the soft bake step of second resist layer 312 (DPT2), the thickness of second resist layer 312 (DPT2) decreases due to solvent evaporation and resist shrinkage. The thickness decrease is greatest in the vicinity of the mark, as discussed below.

Figure 6:
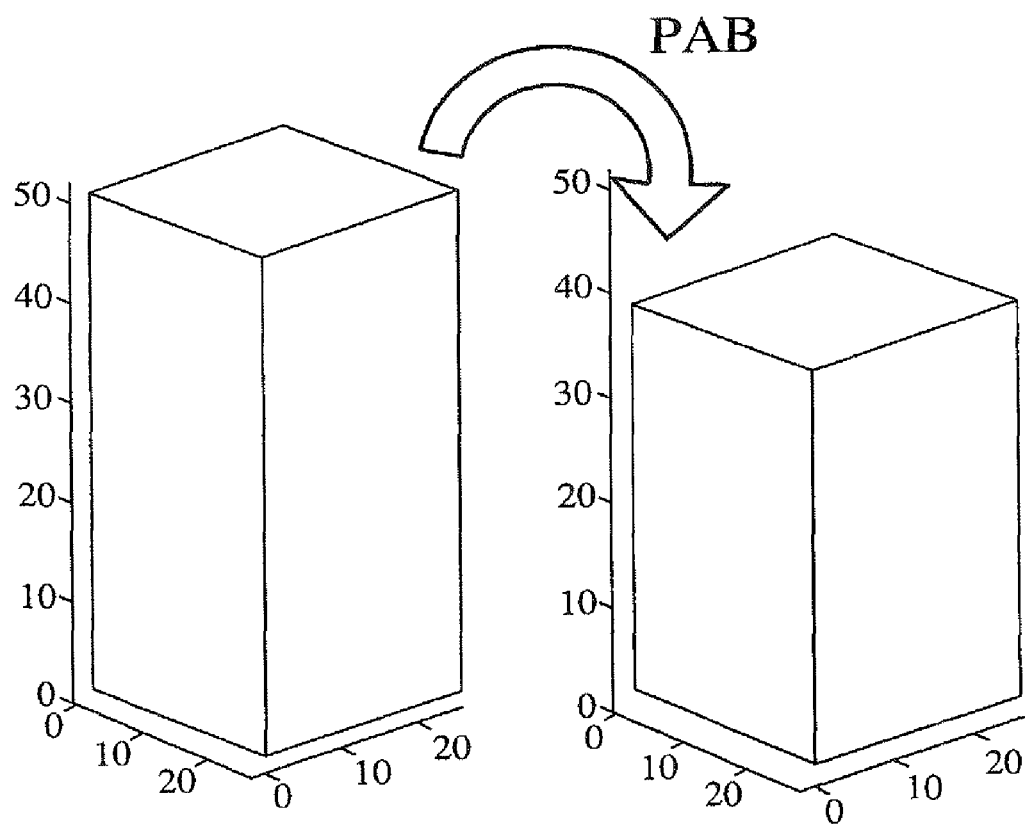
FIG. 6 illustrates the results of Monte Carlo simulations of changes in resist layer thickness during a soft bake step.

FIG. 6 graphically provides the results of Monte Carlo simulations of resist layer thickness change during a soft bake (post-application bake or PAB) due to solvent evaporation and resist shrinkage. The greater the pre-soft bake resist layer thickness, the greater the shrinkage. Second resist layer 312 (DPT2) thickness in the trenches of the mark before the soft bake is larger by virtue of the mark. As a consequence, the resulting shrink of second resist layer 312 (DPT2) during soft bake will be larger. Hence, the mark topography in second resist layer 312 (DPT2) is formed.

FIG. 7 illustrates the process for forming a symmetric alignment mark. FIG. 7A portrays a stack of wafer layers, with a second resist layer 712 deposited on a first resist layer 702. First resist layer 702 is in turn deposited on top of a layer of Bottom Anti-Reflective Coating (BARC) 704, and a hardmask (HM) layer 706. HM layer 706 is deposited on a product layer 708, and a substrate 710. An alignment mark is processed in first resist layer 702. In addition, the alignment mark is planarized during the spin coating of second resist layer 712 (DPT2). FIG. 7B portrays the soft bake step (PAB) of second resist layer 712 that exploits the solvent evaporation and shrinkage effects of second resist layer 712. Finally, FIG. 7C portrays the resulting symmetric alignment mark topography resulting from the soft bake step of second resist layer 712. Following this, the second patterning step in the double patterning process is undertaken, using the symmetric alignment mark for alignment purposes.

FIG. 8 shows a simulated alignment signal (WQ) and the process-induced alignment error for a symmetric alignment mark having a 20 nm recess, formed in the soft bake step described above. Such an alignment mark generates sufficient alignment signal (WQ), while the process-induced alignment error is minimized. FIG. 8 illustrates these characteristics for a variety of alignment wavelengths, ranging from green (532 nm), red (633 nm), near infra-red (780 nm), and far infra-red (850 nm). FIG. 8A demonstrates the alignment signal (WQ) as a function of depth for these alignment wavelengths. FIG. 8B illustrates the alignment error as a function of depth for these same alignment wavelengths. As FIG. 8B illustrates, the symmetric alignment mark results in virtually no alignment error across the wavelengths.

In order to maximize the utility of various embodiments of the present invention, at least three process adjustments may be employed. Firstly, adjustment of the two second resist layer 712 (DPT2) processing steps (i.e., coat and bake) can be accomplished by selection of solvent content (polymer concentration), resist viscosity, spin coat duration, spin-coating speed, spin speed ramp rate, soft bake duration and temperature parameters. Careful selection of these parameters, while keeping the final second resist layer 712 (DPT2) thickness unchanged allows the formation of symmetric alignment marks during the soft bake process.

Secondly, mark biasing and/or mark sub-segmentation can be used. For example, the size of the alignment marks segments can be adapted to the thickness of first resist layer 702 (DPT1) and second resist layer 712 (DPT2) such that improved planarization results in mark topography created during the soft bake of second resist layer 712 (DPT2). FIG. 9 illustrates an example of mark biasing. Mark biasing results in the changing of the duty cycle of the standard alignment marks, where the duty cycle is determined by computing the ratio of space size to pitch, and then typically expressed as a percentage. FIG. 9A illustrates a 50% duty cycle, while FIG. 9B illustrates a duty cycle in excess of 50%. By careful selection of the duty cycle of the alignment marks with respect to the corresponding resist layer thickness, additional improvement in the alignment can be realized.

Thirdly, the thicknesses of first resist layer 702 (DPT1) and second resist layer 712 (DPT2) can be adjusted to achieve improved mark topography in the soft bake step of second resist layer 712 (DPT2). For example, several processing steps affect the final thickness of first resist layer 702 (DPT1) prior to the coating of second resist layer 712 (DPT2). These processing steps include the baking, exposure and developing of first resist layer 702 (DPT1). By careful selection of these process steps, improved topography in the alignment marks can be achieved during the soft bake of second resist layer 712 (DPT2).

Finally, the above three process adjustments, namely mark biasing and/or sub-segmentation, first resist layer 702 and second resist layer 712 adjustments, and second resist layer 712 (DPT2) processing step adjustments can be employed simultaneously. Applying these refinements together results in an even greater improvement in mark topography for the double patterning process. Such improvements result in greater alignment accuracy, while avoiding additional costly and time-consuming processing steps.

FIG. 10 is a flowchart of an exemplary method 1000, according to an embodiment of the invention. For example, method 1000 may be used to provide alignment in a double patterning process. For example, method 1000 may be carried out using one or more systems described above in FIGS. 1A and 1B.

The process begins at step 1010. In step 1010, a substrate is coated with a first resist layer. In step 1020, the first resist layer is exposed using a patterned beam of radiation to form a first lithography pattern having one or more first alignment marks, and is then developed. The patterned beam of radiation is provided, for example, by radiation source SO, and mask MA, as illustrated in FIGS. 1A and 1B. In step 1030, the first resist layer with the first lithography pattern is frozen. In step 1040, the frozen first lithography pattern is coated with a second resist layer. In step 1050, the second resist layer is baked to form one or more second alignment marks based on the first alignment marks. At step 1060, the one or more second alignment marks are used for alignment of the second exposure step (DPT2) with respect to the pattern exposed in the first exposure step (DPT1). At step 1070, method 1000 ends. Note that the term "one or more second alignment marks" does not imply that these marks are formed during a second exposure step (DPT2). Rather, the "one or more second alignment marks" are formed prior to the second exposure step (DPT2).

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media. Such a computer program can be used in conjunction with, or to control some or all of, apparatus to perform a method as described above.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method, comprising:
    coating a substrate with a first resist layer;
    exposing the first resist layer using a patterned beam of radiation;
    developing the exposed first resist layer to form a first lithography pattern having one or more first alignment marks;
    freezing the first lithography pattern;
    second coating the frozen first lithography pattern with a second resist layer; and
    curing the second resist layer to form one or more second alignment marks based on the one or more first alignment marks.

2. The method of claim 1, wherein the second resist layer is characterized by a viscosity and a polymer characterization, the second coating is characterized by a spin coat duration, a spin coating speed and a spin speed ramp rate, and the curing is characterized by a bake duration and a bake temperature, and wherein the curing includes forming symmetric one or more second alignment marks based on a relationship between one or more of the viscosity, the polymer characterization, the spin coat duration, the spin coating speed, the spin speed ramp rate, the bake duration and the bake temperature.

3. The method of claim 1, wherein the first resist layer is characterized by a first thickness and the second resist layer is characterized by a second thickness, and wherein a feature size within the second alignment marks is based on a relationship between the first thickness and the second thickness.

4. The method of claim 1, wherein the first resist layer is characterized by a first thickness and the second resist layer is characterized by a second thickness, and wherein based on the first thickness and the second thickness, a sub-segmentation of the first alignment marks is used in part to form the one or more second alignment marks.

5. The method of claim 1, wherein the first resist layer is characterized by a first thickness and the second resist layer is characterized by a second thickness, and wherein the curing includes forming symmetric one or more second alignment markers based on a relationship between the first thickness and the second thickness.

6. The method of claim 1, further comprising:
    illuminating the one or more second alignment marks with an alignment beam of radiation resulting in a redirected alignment beam of radiation; and
    detecting the redirected alignment beam of radiation to output an alignment signal.

7. The method of claim 6, wherein the alignment beam of radiation includes a diffuse light source.

8. The method of claim 6, wherein the illuminating the one or more second alignment marks with an alignment beam of radiation includes using an alignment beam of radiation having a wavelength between 532 nm and 850 nm.

9. The method of claim 1, further comprising:
    selecting a duty cycle of the one or more second alignment marks based on the first thickness and the second thickness.

10. The method of claim 9, wherein the selecting the duty cycle includes selecting a value that exceeds 50 percent.

11. The method of claim 9, wherein the selecting the duty cycle includes selecting a value of 50 percent.

12. The method of claim 1, wherein the coating a substrate with a first resist layer further comprises:
  forming a product layer on the substrate;
  disposing a hard mask layer on the product layer;
  forming a bottom anti-reflective coating (BARC) layer on the hard mask layer; and
  coating the first resist layer on the BARC layer.

13. The method of claim 1, further comprising:
  using the one or more second alignment marks as part of a double patterning lithographic process.

* * * * *